(12) United States Patent
Kailasam et al.

(10) Patent No.: US 7,781,327 B1
(45) Date of Patent: Aug. 24, 2010

(54) RESPUTTERING PROCESS FOR ELIMINATING DIELECTRIC DAMAGE

(75) Inventors: Sridhar Kailasam, Fremont, CA (US); Robert Rozbicki, San Francisco, CA (US); Chentao Yu, Sunnyvale, CA (US); Douglas Hayden, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 520 days.

(21) Appl. No.: 11/588,586

(22) Filed: Oct. 26, 2006

Related U.S. Application Data

(63) Continuation-in-part of application No. 10/804,353, filed on Mar. 18, 2004, now Pat. No. 7,186,648, which is a continuation-in-part of application No. 10/412,562, filed on Apr. 11, 2003, now Pat. No. 6,764,940, which is a continuation-in-part of application No. 09/965,472, filed on Sep. 26, 2001, now Pat. No. 6,607,977.

(60) Provisional application No. 60/275,803, filed on Mar. 13, 2001, provisional application No. 60/379,874, filed on May 10, 2002.

(51) Int. Cl.
*H01L 21/4763* (2006.01)
(52) U.S. Cl. ............... 438/622; 257/412; 257/442; 204/192.23; 204/192.37
(58) Field of Classification Search ............ 438/622, 438/624; 257/412, 442; 204/192.23, 192.37
See application file for complete search history.

(56) References Cited

U.S. PATENT DOCUMENTS 3,763,031 A    10/1973   Scow et al.
(Continued)

FOREIGN PATENT DOCUMENTS

EP       0 692 551 A1    1/1996
(Continued)

OTHER PUBLICATIONS

Junqing Lu and Mark J. Kushner, "An Integrated Plasma Equipment-feature Scale Model for Ionized Metal Physical Vapor Deposition", Jun. 2000, University of Illinois (16 pages).
(Continued)

*Primary Examiner*—Phuc T Dang
(74) *Attorney, Agent, or Firm*—Weaver Austin Villeneuve & Sampson LLP

(57) ABSTRACT

Methods of resputtering material from the wafer surface include at least one operation of resputtering material under a pressure of at least 10 mTorr. The methods can be used in conjunction with an iPVD apparatus, such as hollow cathode magnetron (HCM) or planar magnetron. The resputtered material may be a diffusion barrier material or a conductive layer material. The methods provide process conditions which minimize the damage to the dielectric layer during resputtering. The methods allow considerable etching of the diffusion barrier material at the via bottom, while not damaging exposed dielectric elsewhere on the wafer. Specifically, they provide a solution for the dielectric microtrenching problem occurring during conventional resputter process. Furthermore, the methods increase the etch rate to deposition rate ratio (E/D) and improve the etch back nonuniformity (EBNU) of resputter process. In general, the methods provide IC devices with higher reliability and decrease wafer manufacturing costs.

22 Claims, 13 Drawing Sheets

U.S. PATENT DOCUMENTS

| | | | |
|---|---|---|---|
| 3,767,551 A | 10/1973 | Lang et al. | |
| 4,058,430 A | 11/1977 | Suntola et al. | |
| 4,492,620 A | 1/1985 | Matsuo et al. | |
| 4,588,490 A | 5/1986 | Cuomo et al. | |
| 4,604,180 A | 8/1986 | Hirukawa et al. | |
| 4,609,903 A | 9/1986 | Toyokura et al. | |
| 4,622,121 A | 11/1986 | Wegmann et al. | |
| 4,737,384 A | 4/1988 | Murthy et al. | |
| 4,874,493 A * | 10/1989 | Pan | 204/192.11 |
| 4,963,524 A | 10/1990 | Yamazaki | |
| 4,999,096 A | 3/1991 | Nihei et al. | |
| 5,009,963 A | 4/1991 | Ohmi et al. | |
| 5,084,412 A | 1/1992 | Nakasaki | |
| 5,126,028 A | 6/1992 | Hurwitt et al. | |
| 5,139,825 A | 8/1992 | Gordon et al. | |
| 5,178,739 A | 1/1993 | Barnes et al. | |
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |
| 5,482,611 A | 1/1996 | Helmer et al. | |
| 5,622,608 A | 4/1997 | Lanford et al. | |
| 5,629,221 A * | 5/1997 | Chao et al. | 438/591 |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A | 9/1998 | Kenney | |
| 5,904,565 A * | 5/1999 | Nguyen et al. | 438/687 |
| 5,948,215 A | 9/1999 | Lantsman | |
| 5,962,923 A | 10/1999 | Xu et al. | |
| 5,969,422 A | 10/1999 | Ting et al. | |
| 5,985,762 A * | 11/1999 | Geffken et al. | 438/687 |
| 6,037,257 A | 3/2000 | Chiang et al. | |
| 6,046,108 A | 4/2000 | Liu et al. | |
| 6,074,544 A | 6/2000 | Reid et al. | |
| 6,077,403 A | 6/2000 | Kobayashi et al. | |
| 6,077,780 A | 6/2000 | Dubin | |
| 6,080,285 A | 6/2000 | Liu et al. | |
| 6,093,966 A * | 7/2000 | Venkatraman et al. | 257/751 |
| 6,099,702 A | 8/2000 | Reid et al. | |
| 6,100,200 A | 8/2000 | Van Buskirk et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,271,591 B1 | 8/2001 | Dubin et al. | |
| 6,274,008 B1 * | 8/2001 | Gopalraja et al. | 204/192.17 |
| 6,277,249 B1 | 8/2001 | Gopalraja et al. | |
| 6,280,597 B1 | 8/2001 | Kashiwada et al. | |
| 6,287,977 B1 * | 9/2001 | Hashim et al. | 438/722 |
| 6,333,547 B1 | 12/2001 | Tanaka et al. | |
| 6,340,435 B1 | 1/2002 | Bjorkman et al. | |
| 6,342,133 B2 * | 1/2002 | D'Couto et al. | 204/192.17 |
| 6,342,448 B1 | 1/2002 | Lin et al. | |
| 6,350,353 B2 | 2/2002 | Gopalraja et al. | |
| 6,358,376 B1 | 3/2002 | Wang et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 * | 7/2002 | Zhao et al. | 438/627 |
| 6,440,854 B1 | 8/2002 | Rozbicki | |
| 6,448,176 B1 * | 9/2002 | Grill et al. | 438/637 |
| 6,451,177 B1 | 9/2002 | Gopalraja et al. | |
| 6,492,262 B2 * | 12/2002 | Uzoh | 438/637 |
| 6,498,091 B1 | 12/2002 | Chen et al. | |
| 6,500,762 B2 | 12/2002 | Hashim et al. | |
| 6,509,267 B1 | 1/2003 | Woo et al. | |
| 6,538,324 B1 * | 3/2003 | Tagami et al. | 257/751 |
| 6,541,374 B1 | 4/2003 | de Felipe et al. | |
| 6,554,914 B1 | 4/2003 | Rozbicki et al. | |
| 6,559,061 B2 | 5/2003 | Hashim et al. | |
| 6,562,715 B1 | 5/2003 | Chen et al. | |
| 6,566,246 B1 | 5/2003 | de Felipe et al. | |
| 6,589,887 B1 | 7/2003 | Dalton et al. | |
| 6,605,534 B1 * | 8/2003 | Chung et al. | 438/674 |
| 6,607,977 B1 * | 8/2003 | Rozbicki et al. | 438/627 |
| 6,607,982 B1 | 8/2003 | Powell et al. | |
| 6,613,199 B1 | 9/2003 | Tobin et al. | |
| 6,624,066 B2 | 9/2003 | Lu et al. | |
| 6,642,146 B1 | 11/2003 | Rozbicki et al. | |
| 6,652,718 B1 | 11/2003 | D'Couto et al. | |
| 6,656,841 B1 * | 12/2003 | Kim | 438/687 |
| 6,660,622 B2 | 12/2003 | Chen et al. | |
| 6,673,716 B1 | 1/2004 | D'Couto et al. | |
| 6,706,155 B2 | 3/2004 | Morimoto et al. | |
| 6,709,557 B1 | 3/2004 | Kailasam et al. | |
| 6,709,987 B1 | 3/2004 | Hashim et al. | |
| 6,755,945 B2 | 6/2004 | Yasar et al. | |
| 6,758,947 B2 | 7/2004 | Chiang et al. | |
| 6,764,940 B1 | 7/2004 | Rozbicki et al. | |
| 6,784,096 B2 | 8/2004 | Chen et al. | |
| 6,790,776 B2 | 9/2004 | Ding et al. | |
| 6,841,044 B1 | 1/2005 | Ruzic | |
| 6,893,541 B2 | 5/2005 | Chiang et al. | |
| 6,905,965 B2 | 6/2005 | Subrahmanyan et al. | |
| 6,919,275 B2 * | 7/2005 | Chiang et al. | 438/687 |
| 6,943,111 B2 | 9/2005 | Lin et al. | |
| 6,949,457 B1 * | 9/2005 | Fiordalice et al. | 438/627 |
| 6,969,448 B1 | 11/2005 | Lau | |
| 6,992,012 B2 | 1/2006 | Haskim et al. | |
| 7,030,031 B2 * | 4/2006 | Wille et al. | 438/725 |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,135,402 B2 * | 11/2006 | Lin et al. | 438/639 |
| 7,186,648 B1 | 3/2007 | Rozbicki et al. | |
| 7,253,109 B2 | 8/2007 | Ding et al. | |
| 7,294,574 B2 | 11/2007 | Ding et al. | |
| 7,365,001 B2 | 4/2008 | Yang et al. | |
| 2001/0039113 A1 | 11/2001 | Blalock et al. | |
| 2002/0000382 A1 | 1/2002 | Morrissey et al. | |
| 2002/0041028 A1 | 4/2002 | Choi et al. | |
| 2002/0110999 A1 | 8/2002 | Lu et al. | |
| 2003/0034244 A1 | 2/2003 | Yasar et al. | |
| 2003/0116427 A1 | 6/2003 | Ding et al. | |
| 2003/0129828 A1 | 7/2003 | Cohen | |
| 2004/0048461 A1 | 3/2004 | Chen | |
| 2004/0171250 A1 | 9/2004 | Chiang et al. | |
| 2004/0188239 A1 | 9/2004 | Robison et al. | |
| 2004/0211661 A1 | 10/2004 | Zhang et al. | |
| 2004/0224507 A1 | 11/2004 | Marieb et al. | |
| 2005/0006222 A1 | 1/2005 | Ding et al. | |
| 2005/0020080 A1 | 1/2005 | Chiang et al. | |

| | | |
|---|---|---|
| 2005/0032382 A1 | 2/2005 | Rossman |
| 2005/0085068 A1 | 4/2005 | Chiang et al. |
| 2005/0085070 A1 | 4/2005 | Park |
| 2005/0103620 A1 | 5/2005 | Chistyakov |
| 2005/0110147 A1 | 5/2005 | Wu et al. |
| 2005/0173239 A1 | 8/2005 | Somekh et al. |
| 2005/0186793 A1 | 8/2005 | Omoto et al. |
| 2005/0211545 A1 | 9/2005 | Cerio, Jr. et al. |
| 2005/0252765 A1 | 11/2005 | Zhang et al. |
| 2005/0255690 A1 | 11/2005 | Chen et al. |
| 2005/0255691 A1 | 11/2005 | Ding et al. |
| 2005/0255700 A1 | 11/2005 | Gopalraja et al. |
| 2005/0266682 A1 | 12/2005 | Chen et al. |
| 2005/0272254 A1 | 12/2005 | Ding et al. |
| 2006/0014378 A1 | 1/2006 | Aggrawal et al. |
| 2006/0024953 A1 | 2/2006 | Rao et al. |
| 2006/0030151 A1 | 2/2006 | Ding et al. |
| 2006/0057843 A1 | 3/2006 | Chen et al. |
| 2006/0207873 A1 | 9/2006 | Fu |
| 2007/0020922 A1 | 1/2007 | Chiang et al. |
| 2007/0178682 A1 | 8/2007 | Chiang et al. |
| 2007/0193982 A1 | 8/2007 | Brown et al. |
| 2008/0190760 A1 | 8/2008 | Tang et al. |
| 2008/0310005 A1 | 12/2008 | Tonar et al. |

FOREIGN PATENT DOCUMENTS

| | | |
|---|---|---|
| JP | 11-186273 | 9/1999 |

OTHER PUBLICATIONS

Gabriel Font and Mark J. Kushner, "Scaling of Hollow Cathode Magnetrons for Metal Deposition", Oct. 1999, University of Illinois (20 pages).

Danek et al, "Barrier First Method For Single Damascene Trench Applications", Novellus Systems, Inc. U.S. Appl. No. 10/804,353, filed Mar. 18, 2004 pp. 1-31.

Schumacher Products, TDEAT (Tetrakis-diethylamino Titanium), Electronic Grade, www.schumacher.com/tdeat.html, printed Jun. 5, 2001, 1 page.

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10. mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-Jun. 18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics", 1999.

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of A1 to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiNAdhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, J. Phys. Chem., 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between A Diffusion Barrier Layer and A Seed Layer," Novellus Systems, Inc., U.S. Appl. No. 11/807,178, filed May 24, 2007.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 26, 2009 for U.S. Appl. No. 11/564,222.

Notice of Allowance and Fee Due mailed Jun. 17, 2009 for U.S. Appl. No. 11/888,323.

U.S. Final Office Action mailed Jun. 17, 2009 for U.S. Appl. No. 11/701,984.

U.S. Office Action mailed Aug. 3, 2009 for U.S. Appl. No. 11/714,465.

U.S. Office Action mailed Jul. 23, 2009 for U.S. Appl. No. 12/122,118.

Shaviv et al., "Conformal Films on Semiconductor Substrates" Novellus Systems, Inc., U.S. Appl. No. 12/467,200, filed May 15, 2009.

Notice of Allowance, mailed Sep. 18, 2009 for U.S. Appl. No. 11/903,487 and Allowed Claims.

U.S. Office Action for U.S. Appl. No. 12/154,984, mailed Oct. 6, 2009.

D'Couto et al. J. Vac. Sci. Technol. B. 2001, 19(1), pp. 244-249.

Notice of Allowance and Allowed Claims, mailed Nov. 9, 2009 for U.S. Appl. No. 11/701,984.

Rozbicki et al., "Multistep Method of Depositing Metal Seed Layers" Novellus Systems, Inc., U.S. Appl. No. 12/699,738, filed Feb. 3, 2010.

U.S. Office Action mailed Feb. 4, 2010 for U.S. Appl. No. 11/807,179.

U.S. Office Action mailed Mar. 2, 2010 for U.S. Appl. No. 11/807,182.

Wu et al., "Deposition of Doped Copper Seed Layers Having Improved Reliability," Novellus Systems, Inc., U.S. Appl. No. 12/122,118, filed May 16, 2008.

U.S. Office Action mailed Jun. 26, 2008, from U.S. Appl. No. 11/473,618.

U.S. Office Action mailed May 2, 2008, from U.S. Appl. No. 11/558,693.

U.S. Office Action mailed Dec. 12, 2008, from U.S. Appl. No. 11/714,465.

Notice of Allowance and Fee Due mailed Nov. 24, 2008, from U.S. Appl. No. 11/558,693.

Allowed Claims from U.S. Appl. No. 11/558,693.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S. Appl. No. 10/412,562.

Allowed Claims from U.S. Appl. No. 10/412,562.

Notice of Allowance and Fee Due mailed Oct. 3, 2006, from U.S. Appl. No. 10/804,353.

Allowed Claims from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

* cited by examiner

RESPUTTERING PROCESS FOR ELIMINATING DIELECTRIC DAMAGE

CROSS-REFERENCE TO RELATED APPLICATIONS

This application is a continuation-in-part claiming priority under 35 USC 120 from U.S. patent application Ser. No. 10/804,353 filed Mar. 18, 2004 (now U.S. Pat. No. 7,186, 648), titled "Barrier First Method For Single Damascene Trench Applications," naming Rozbicki et al. as inventors, which is a continuation-in-part claiming priority under 35 USC 120 from U.S. patent application Ser. No. 10/412,562 filed Apr. 11, 2003 (now U.S. Pat. No. 6,764,940), which is a continuation-in-part claiming priority under 35 USC 120 from U.S. patent application Ser. No. 09/965,472 filed Sep. 26, 2001 (now U.S. Pat. No. 6,607,977), which claims benefit of prior U.S. Provisional Application No. 60/275,803 filed Mar. 13, 2001. U.S. Pat. No. 6,764,940 also claims benefit of U.S. Provisional Patent Application No. 60/379,874 filed May 10, 2002. Each of these references is incorporated herein by reference in its entirety for all purposes.

FIELD OF THE INVENTION

The present invention pertains to methods of resputtering layers of material on a partially fabricated integrated circuit. The methods are particularly useful for resputtering diffusion barrier layers and copper seed layers. The methods can also be applied for resputter etch back of other wafer materials, such as conductive lines.

BACKGROUND OF THE INVENTION

Miniaturization of integrated circuit (IC) devices demands superior electrical properties from both dielectric and conductive materials used in the manufacturing of an integrated circuit. Traditionally used materials, such as aluminum as a conductor and silicon dioxide as an insulator no longer provide adequate electrical characteristics at the modern level of miniaturization. Therefore, the manufacturers of IC devices are now employing new dielectric materials with lower dielectric constant than silicon dioxide and are increasingly turning to copper as a conductor, due to its low resistivity. The low-k dielectric materials used in the IC device processing include carbon doped silicon dioxide, hydrogenated silicon oxycarbides (SiCOH), fluorine doped silicon dioxide, and organic-containing low-k dielectrics. These materials, due to their low dielectric constants, provide low parasitic capacitance and minimize the "crosstalk" between the interconnects in an integrated circuit. At the same time, they are often porous foam-like materials and are generally more easily damaged during the processing steps than silicon dioxide. The impact of high-energy ions during such processing steps as PVD often results in undesired etching and microtrenching in the low-k dielectric layer. This problem is usually less pronounced when silicon dioxide is used.

The use of copper as a conductor, in addition to an obvious benefit of better conductive properties, also gives rise to several problems which are obviated by using a different processing technique than one traditionally employed with aluminum. One of these problems is a facile diffusion of copper into the adjacent dielectric layer. This diffusion results in a degradation of the insulating properties of a dielectric even at very low concentrations. This problem is solved by using a diffusion barrier layer between copper lines and a dielectric.

Another problem in processing copper-containing ICs is that copper is not amenable to patterning by plasma etching. This can be obviated by using Damascene processing, a method which requires fewer processing steps than other methods and offers a higher yield.

Damascene processing is a method for forming interconnections on integrated circuits. It involves formation of inlaid metal lines in trenches and vias formed in a dielectric layer (inter-metal dielectric). In order to frame the context of this invention, a brief description of a copper dual Damascene process for forming a partially fabricated integrated circuit is described below. Note that the invention applies to other fabrication processes including single Damascene processes.

Presented in FIGS. 1A-1F, is a cross sectional depiction of device structures created at various stages of a dual Damascene fabrication process. A cross sectional depiction of a completed structure created by the dual Damascene process is shown in FIG. 2. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by inlaying with copper conductive routes 107. Because copper or other mobile conductive material provides the conductive paths of the semiconductor wafer, the underlying silicon devices must be protected from metal ions (e.g., $Cu^{2+}$) that might otherwise diffuse or drift into the silicon. Suitable materials for diffusion barrier 105 include tantalum, tantalum nitride, tungsten, titanium tungsten, titanium nitride, tungsten nitride, cobalt, ruthenium and the like. In a typical process, barrier 105 is formed by a physical vapor deposition (PVD) process such as sputtering, a chemical vapor deposition (CVD) process, or an atomic layer deposition (ALD) process. Typical metals for the conductive routes are aluminum and copper. More frequently, copper serves as the metal in Damascene processes, as depicted in these figures. The resultant partially fabricated integrated circuit 100 is a representative substrate for subsequent Damascene processing, as depicted in FIGS. 1B-1F.

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. This is followed by deposition of an etch-stop layer 113 (typically composed of silicon nitride or silicon carbide) on the first dielectric layer 111.

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically a silicon oxynitride, follows.

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Next, as depicted in FIG. 1F, these newly formed vias and trenches are, as described above, coated with a diffusion barrier 123. As mentioned above, barrier 123 is made of tantalum, or other materials that effectively block diffusion of copper atoms into the dielectric layers.

After diffusion barrier 123 is deposited, a seed layer of copper is applied (typically a PVD process) to enable subsequent electrofilling of the features with copper inlay. FIG. 2 shows the completed dual Damascene process, in which copper conductive routes 125 are inlayed (seed layer not depicted) into the via and trench surfaces over barrier 123.

Copper routes 125 and 107 are now in electrical contact and form conductive pathways, as they are separated only by diffusion barrier 123, which is also somewhat conductive. Traditionally these diffusion barriers are deposited using PVD methods because of the high quality resultant films. However, when depositing in features with higher aspect ratios such as the narrow vias within modern technologies, PVD methods tend to produce films with poor sidewall coverage and thick bottom coverage.

Therefore there is a need for a method that would remove some of the barrier layer from the via bottom and would increase the coverage of the via sidewalls. It is also sometimes desirable to remove all of the barrier layer from the via bottom, and even etch out some of the underlying copper layer, while maintaining the sidewall coverage. Ideally, this method should be selective for the via bottom region, and should not affect the trenches. However, good selectivity cannot be achieved in currently available methods. Therefore it is preferable, that any such method employed should cause the least possible damage in the trenches, while removing the material from the via bottom.

SUMMARY OF THE INVENTION

The present invention pertains to iPVD-based methods of resputtering material from the wafer surface. It significantly improves several characteristics of the resputter process used for removal and redistribution of diffusion barrier layers or conductive layers of the wafer. The invention provides process conditions which minimize the damage to the dielectric layer during resputtering. The invention allows considerable etching of the diffusion barrier material at the via bottom, while not damaging exposed dielectric elsewhere on the wafer. Specifically, it provides a solution for the dielectric microtrenching problem occurring during conventional resputter process. Furthermore, the invention increases the etch rate to deposition rate (E/D) ratio, which is desirable during resputter because it improves the effectiveness of the etch back. Still further, the etch back nonuniformity (EBNU) is greatly improved by the methods of this invention. Improvement of EBNU results in better overall reliability of the IC device. In general, this invention provides IC devices with higher reliability and decreases wafer manufacturing costs.

The present invention pertains to various methods for resputtering layers of material on the semiconductor wafer surface having recessed features, such as vias and trenches. In one embodiment the method of this invention comprises at least a step of resputtering the material at a pressure of at least 10 mTorr. This method may be performed in an apparatus that does not include inductively coupled plasma source. Such apparatus may include a process chamber having a planar or hollow target.

In certain embodiments the method of this invention involves at least two operations. The first operation deposits material, such as diffusion barrier material or copper seed layer, on a wafer surface. The second operation resputters the deposited material at a pressure of at least 10 mTorr. In this embodiment the resputter step is performed in an apparatus without using an inductively coupled plasma (ICP) source.

The deposition process may be performed by sputtering the material using iPVD. Other deposition techniques, such as ALD or CVD may also be used. The deposited layer usually has low uniformity, with over-accumulation of material in the bottom of the vias and insufficient coverage of via sidewalls. This presents a particular problem for diffusion barrier layer formation, since continuous thin layers of barrier material are universally preferred in the industry. The barrier layer materials, such as Ta, $TaN_x$, Ti, $TiN_x$, W, $WN_x$, Co and Ru have only moderate conductivity, and accumulation of these materials in the via bottom decreases conductivity of the via pathway. Insufficient coverage of sidewalls causes reliability problems due to increased diffusion of copper into the adjacent dielectric layer. The uniformity of the coverage is ameliorated by the resputtering step in which material is resputtered from the via bottom onto the via sidewalls. Resputtering may also be used for resputter etching of the copper lines underlying the via (sometimes referred to as "anchoring").

The deposition and/or resputter steps may be performed in a suitable iPVD apparatus such as hollow cathode magnetron (HCM) or a planar magnetron. In a separate embodiment, the methods of this invention can be practiced in a planar or hollow magnetron employing an ICP source. In this case the deposited material is resputtered under pressure of about 50 to 100 mTorr, and preferably of about 60 to 90 mTorr.

In a preferred embodiment of this invention both deposition and resputter steps are performed in the same process chamber. The deposition and resputter steps can be repeated as many times as necessary to achieve the desired uniformity of the barrier layer coverage.

In one embodiment of this invention the recessed features are formed in a low-k dielectric layer. Low-k dielectrics are particularly prone to microtrenching during resputter. The method of present invention provides resputter conditions which practically eliminate microtrenching in a dielectric. Resputtering the barrier layer at a pressure of about 30-100 mTorr and more preferably 50-70 mTorr results in the IC structures essentially free of microtrenches. These pressure ranges also increase etch rate to deposition rate ratio (E/D) and decrease etch back nonuniformity (EBNU).

The present invention also encompasses an apparatus which can be used for deposition and resputtering steps. In one embodiment this apparatus does not make use of inductively coupled plasma (ICP). Such an apparatus, in addition to a process chamber having a target for sputtering the material onto the semiconductor wafer and a wafer support for holding the wafer in position during deposition of the material, has a controller with program instructions for the deposition step and for the resputter step. The instructions specify a pressure of at least 10 mTorr for the resputter step and may also include other pressure ranges such as a range from about 30 to 100 mTorr, and from about 50 to 70 mTorr. The instructions can also be used for generating a plasma comprising ionized material sputtered from the target. The target is usually composed of the metal to be deposited, which may be a metal used in formation of a diffusion barrier layer or a seed layer metal. The instructions can also specify that the deposition and resputter steps may be repeated as many times as requested by the operator. Examples of such an apparatus include an HCM and a planar magnetron.

These and other features and advantages of the present invention will be described in more detail below with reference to the associated drawings.

DETAILED DESCRIPTION OF PREFERRED EMBODIMENTS

The etch-back of the barrier layer can be accomplished by a technique known as the resputter process. As explained below, resputtering may take place in the same chamber as the iPVD process and employ similar process conditions, but without significant deposition. In this process ionic species are directed towards the wafer and upon collision with the wafer surface, resputtering of the wafer material occurs. The ions are usually formed by ionization of the process gas in the iPVD magnetron chamber. However, the plasma conditions are controlled so that the gas ions do not significantly contact the target. Nevertheless, in some embodiments of this invention there may be a component of ionized metal in addition to ionized gas resputtering wafer material. Commonly employed process gases are inert gases such as argon and krypton and their mixtures with nitrogen. The resputtering process is typically carried out at temperatures of up to 500° C. The traditionally used pressure for resputtering is less than 10 mTorr, preferably from 2 to 5 mTorr.

The resputtering process is most often used for resputtering of the diffusion barrier layer, but can also be employed in the etch-back or redistribution of other wafer materials such as conductive metal layers; e.g., copper seed layers. Diffusion barrier materials commonly subjected to resputtering include but are not limited to tantalum, titanium, tungsten, ruthenium, cobalt, solid solutions of these metals and nitrogen and binary nitrides (e.g. $TaN_x$, $TiN_x$, $WN_x$). Copper is also a commonly resputtered material.

Figure 3:
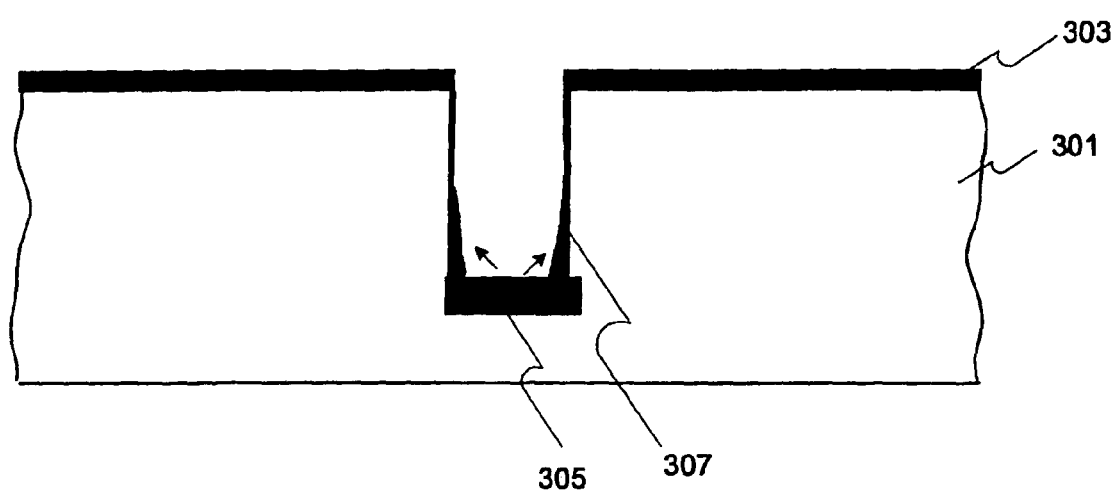
FIG. 3 shows a cross-sectional depiction of a via illustrating resputtering of the barrier layer from the via bottom.

In high aspect ratio recesses resputter leads to removal of some or all of the barrier layer at the bottom of the recess, while covering the sidewalls of the recess with the resputtered material. This can be advantageous because sidewalls are sometimes insufficiently covered during the basic PVD or iPVD process. FIG. 3 illustrates the resputter process in a high aspect ratio via. A cross-sectional view of the wafer portion is shown. The depicted via lies in the dielectric layer 301, and a diffusion barrier layer 303 covers the dielectric layer both in the field and in the via. Note the significant accumulation of the diffusion barrier material in the bottom of the via 305. During resputter process the energetic ions hit the bottom of the via, resulting in the barrier material atoms being sputtered onto the sidewalls, as illustrated by the arrows in FIG. 3. The net result of this process is the removal of the material from the bottom of the via and its deposition on the via sidewalls 307.

The effect of resputter in the field and in the trenches is less pronounced than in the via bottom. The usual result of resputtering in the field and in the trenches is the etch-back of the field and trench material which is normally less than the etch-back occurring in the via bottom. It is of course possible to achieve considerable etching of material in the trenches and in the field during resputter when the via bottom is etched by resputter to an even greater degree. While the term "resputtering" includes a wide range of possible deposition conditions, it is generally understood to imply that a net etching or removal of material occurs at the bottom of a recess being resputtered (e.g. a via and/or trench). Whether or not there is a net etch or deposition at other regions of the workpiece does not change the fact that resputtering is taking place.

Redistribution of the barrier material from the via bottom to the via sidewalls serves two purposes. First, it decreases the resistance at the via bottom by removing the excess of the barrier layer which is usually composed of only moderately conductive material. Ideally, resistance at the via bottom should be minimized to allow flow of the current from the underlying copper lines into the via after it is filled with copper or other conductive material. Secondly, it provides sufficiently thick coverage of the via sidewalls with the barrier layer, thus addressing reliability issues such as stress migration and electromigration resistance. In general, the resputtering process is not limited to barrier layer redistribution or etch back and can be applied to other wafer materials.

An important characteristic of iPVD processes is the etch rate to deposition rate ratio (E/D). It should be understood, that both etching and depositing processes are occurring simultaneously during iPVD and resputter. Etching is the result of inert gas ions bombarding the wafer, while deposition is the result of inert gas ions bombarding the target, and sputtering target material (neutral or ionic) onto the wafer surface. In some embodiments of this invention, ionized metal may be used together with ionized gas for resputtering of wafer materials. The etch and deposition processes can be controlled by modulating the power at the target and at the wafer pedestal. For example, to achieve high E/D ratio needed for resputter, the power at the target is decreased while the power at the wafer pedestal (bias) is increased. This results in inert gas ions being directed not to the target but to the wafer, leading to etching of the wafer layer (resputter). Commonly employed DC target power for the resputter process is 1-8 kW, preferably 1-6 kW. The bias power for resputtering can range from about 100 to about 3000 W, preferably from about 600 to about 1500 W, and even more preferably from about 900 to about 1200 W. Conversely, if the power at the target is increased and the bias at the wafer is decreased or turned off, the inert gas ions are directed towards the target, leading to deposition of the target material on the wafer. The DC target power used for deposition step ranges from 10 to 60 kW, preferably 20-35 kW, and more preferably 20-30 kW. The bias power during deposition can range from about 0 to about 3000 W, more preferably from about 500 to about 1200 W.

At the E/D ratio of 1 no net deposition or etching is occurring. At the E/D ratio of 0, the process is entirely depositing. At E/D ratios of more than 1 etching predominates, this being characteristic of resputter. The E/D ratio is not necessarily the same in different features of the wafer. For example, the E/D ratio in the field, in the trench, and in the via may have different values. These values usually correlate with the aspect ratio of the feature, being the largest in the highest aspect ratio recesses and decreasing as the aspect ratio decreases. Therefore, it is possible to have net deposition in the field region (E/D<1) and net etch at the via bottom (E/D>1). The resputter process can be defined as an iPVD-based method which provides an E/D>1 in the bottom of the feature or features where resputtering is desired, e.g. the lowest lying feature on the wafer or in some cases the feature having the highest aspect ratio. Commonly, E/D ratio during resputter can reach values of up to about 1.5. This E/D ratio can be increased by modulation of process parameters such as magnetic field to about 4.

As the etching and depositing rates can be easily modulated by adjusting the power of the target and the bias, it is natural that both the deposition and resputter steps can be carried out in the same process chamber. Moreover, since it is often desirable to increase the conformity of barrier layer coverage on the wafer by applying several cycles of deposition and resputter steps, some or all of these cycles can be accomplished in the same chamber.

Figure 4:
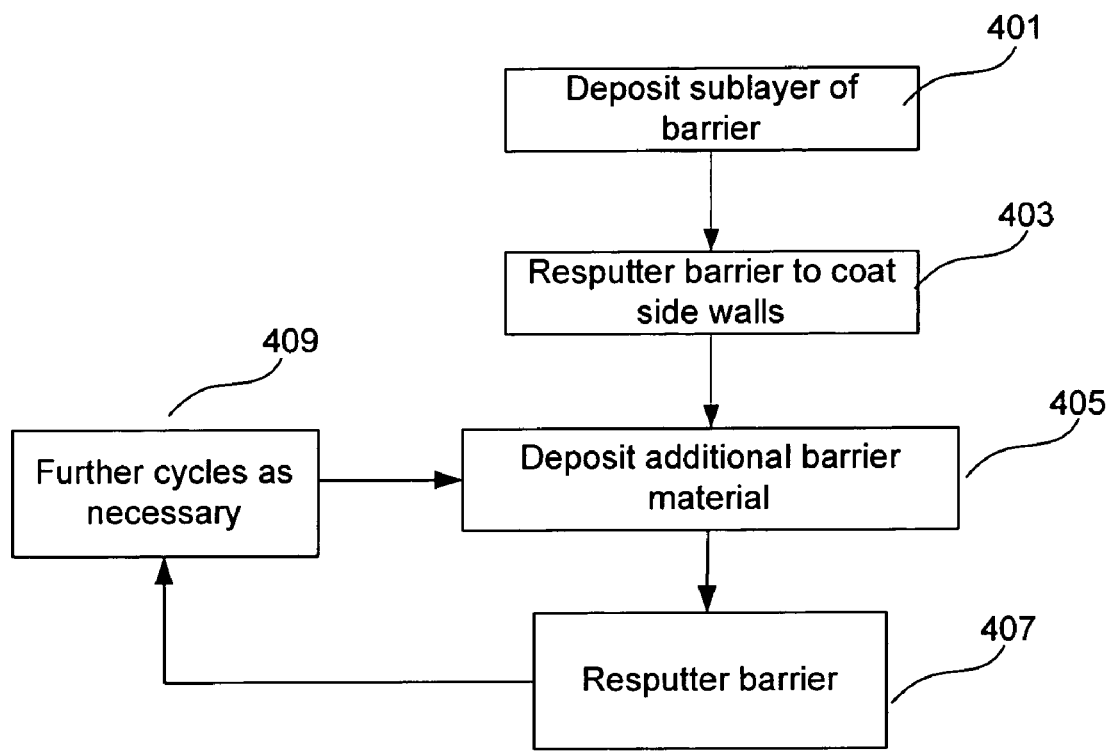
FIG. 4 presents a process flow diagram for a method of forming a diffusion barrier layer on a partially fabricated integrated circuit.

One example of a sequence of depositing and resputtering steps is illustrated in FIG. 4. The process starts with the deposition of barrier sublayer (process block 401). This deposition process may be accomplished by a PVD or iPVD technique but other deposition methods may be also used. These methods may include chemical vapor deposition (CVD), plasma enhanced chemical vapor deposition (PECVD), atomic layer deposition (ALD), electroless deposition, selective reduction of an organometallic precursor from a supercritical solution, and the like. The deposited barrier material is then resputtered (403) to achieve the coating of the sidewalls in the high aspect ratio recesses. The process may stop at this point or, if a more uniform or thicker barrier coverage is desired, more barrier material may be deposited (405) by any of the above mentioned methods, and then resputtered again (407). The depositing and resputtering steps may be optionally repeated as many times as necessary (409). In one embodiment some or all of these steps are performed in the same process chamber. The process depicted in FIG. 4 serves as an illustration of deposition and resputtering cycles employed to achieve uniformity of the barrier level coverage. The present invention is not limited to the process flow scheme shown in FIG. 4, and may include resputtering of all of the barrier layer from the via bottom or punch-through resputter etch into the underlying copper lines. Other steps may be added to the general process flow as necessary.

Resputtering process is now used for redistribution of barrier material and for etching of the conductive lines. The present invention improves several important characteristics of the resputter process—an etch rate to deposition rate ratio (E/D) and etch-back nonuniformity (EBNU). It also addresses the microtrenching problem, which is discussed below.

Figure 1A:
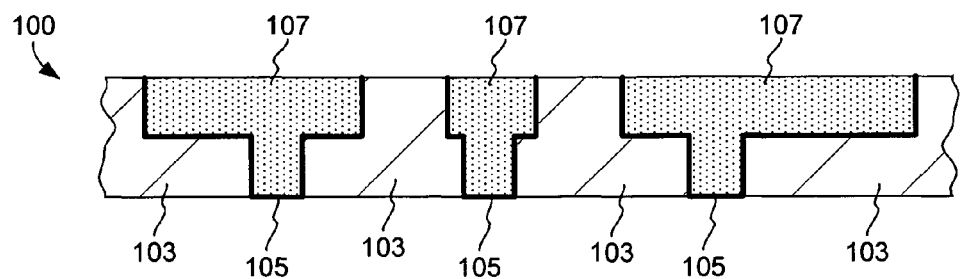
FIGS. 1A-1F show cross sectional depictions of device structures created during a copper dual Damascene fabrication process.
Figure 1B:
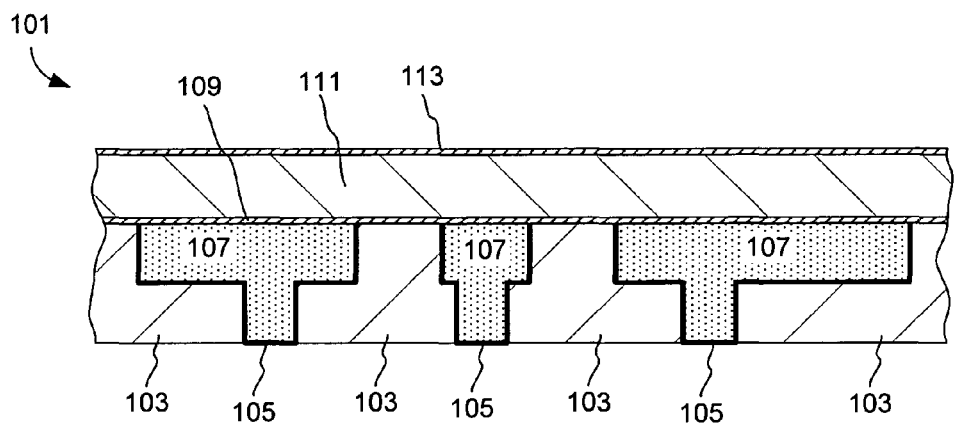
Figure 1C:
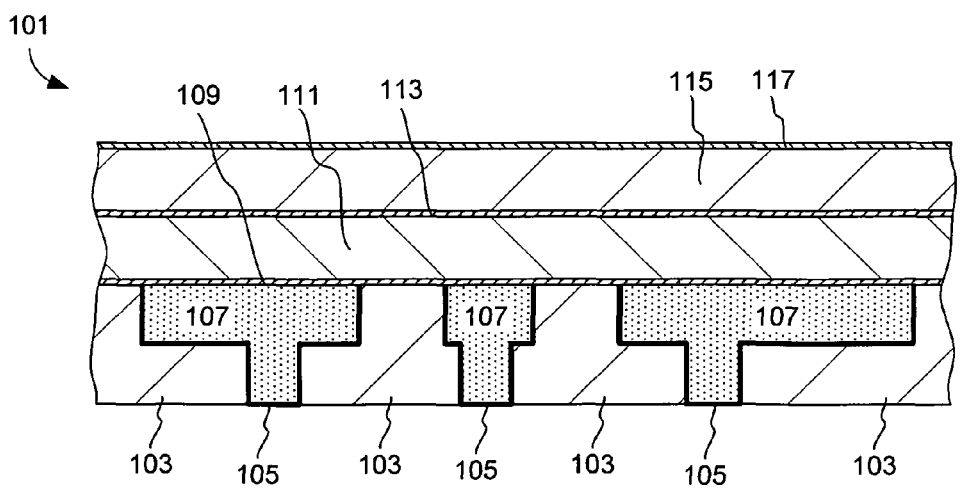
Figure 1D:
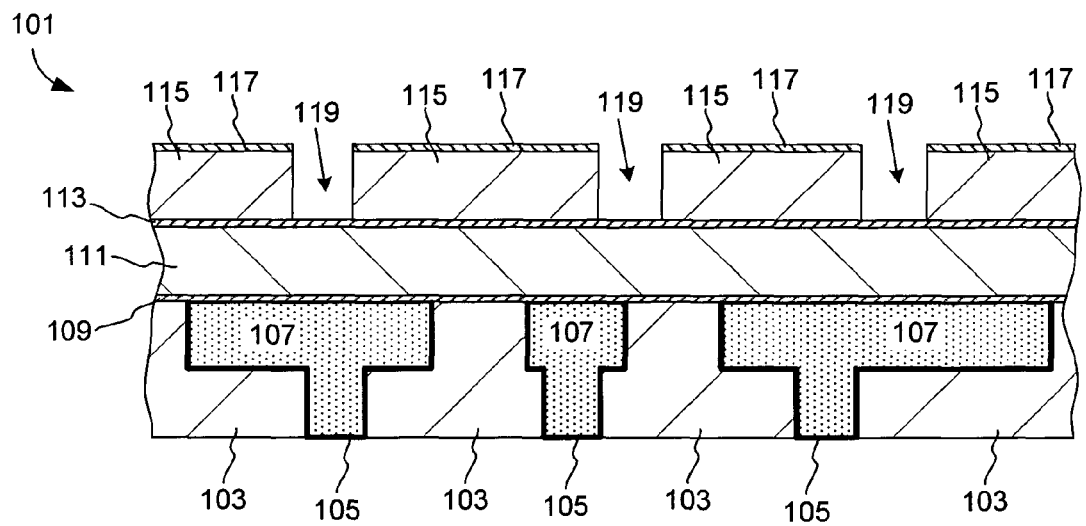
Figure 1E:
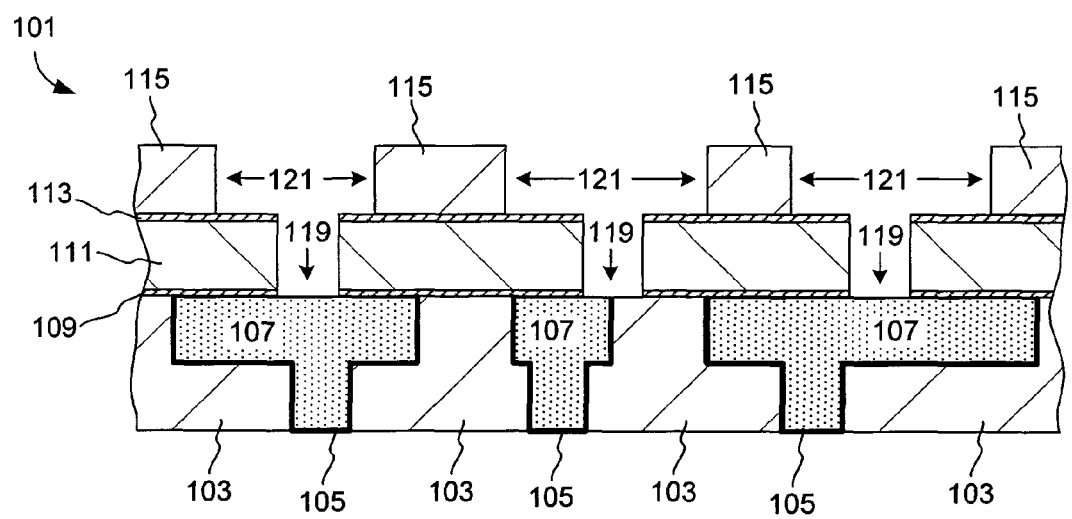
Figure 1F:
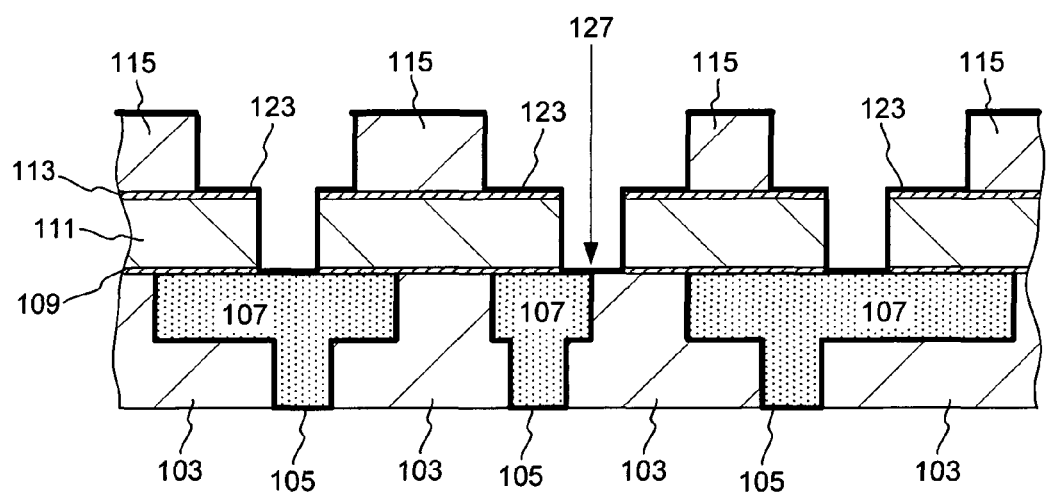
Figure 2:
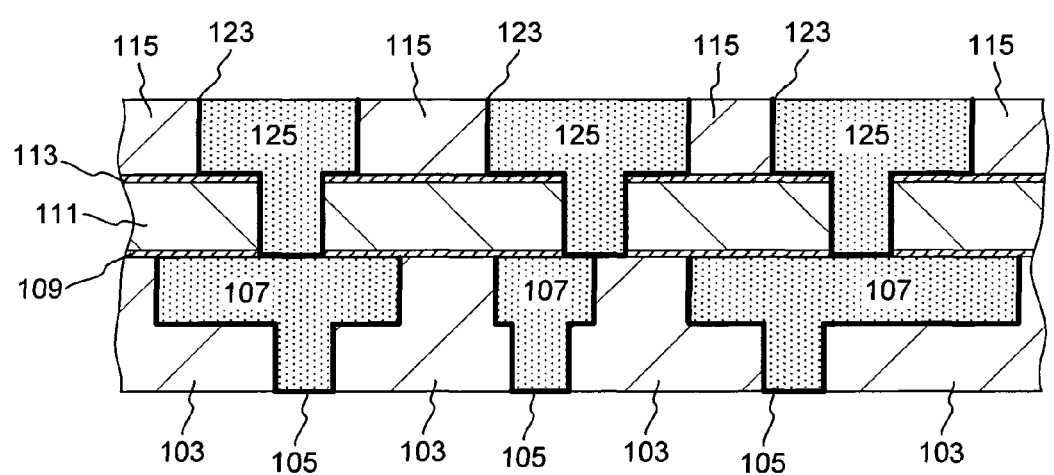
FIG. 2 shows a cross sectional depiction of a two metal levels in a device created using the copper dual Damascene process of FIGS. 1A-1F.
Figure 5A:
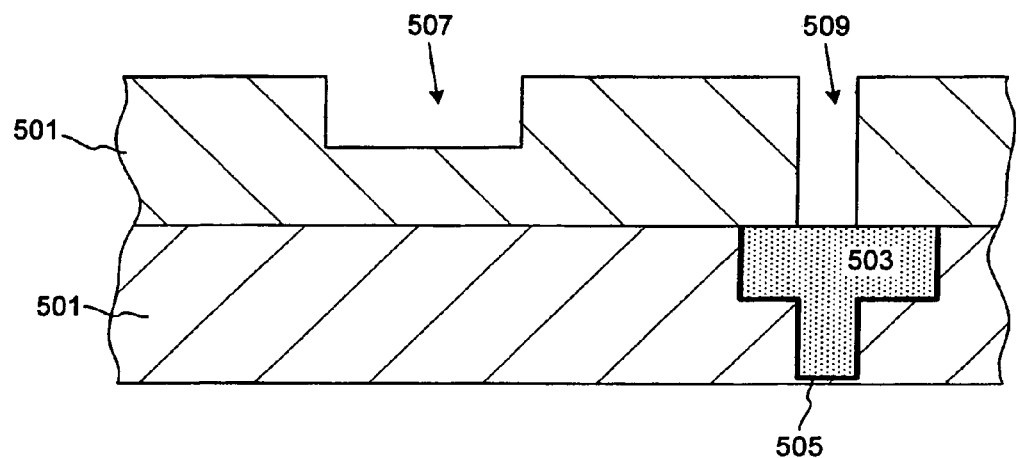
FIGS. 5A-5D show cross sectional depictions of a partially fabricated integrated circuit during barrier layer deposition and low pressure resputter processes. Microtrenching phenomenon is illustrated.

It is often desirable to use resputter for etching through the via into the underlying copper line. The sequence of wafer processing steps resulting in such punch-through etching is depicted in FIGS. 5A-5D. Referring to FIG. 5A, a cross-sectional depiction of wafer substrate is shown. The substrate comprises two layers of dielectric 501, where the top layer is patterned with two recesses, a trench 507, and a via 509. The dielectric 501 may be a low-k dielectric such as carbon doped silicon dioxide, hydrogenated silicon oxycarbide (SiCOH), fluorine doped silicon dioxide, or organic-containing low-k dielectric. A conductive line 503 resides in the underlying dielectric layer directly below the via 509. Conductive lines are most commonly copper lines. The sides and the bottom of the copper line are coated with a diffusion barrier layer 505, which prevents the diffusion of copper into the dielectric layer 501. Etch-stop and antireflective layers, such as 113 and 117 of FIG. 1B, are not shown for clarity reasons.

Figure 5B:
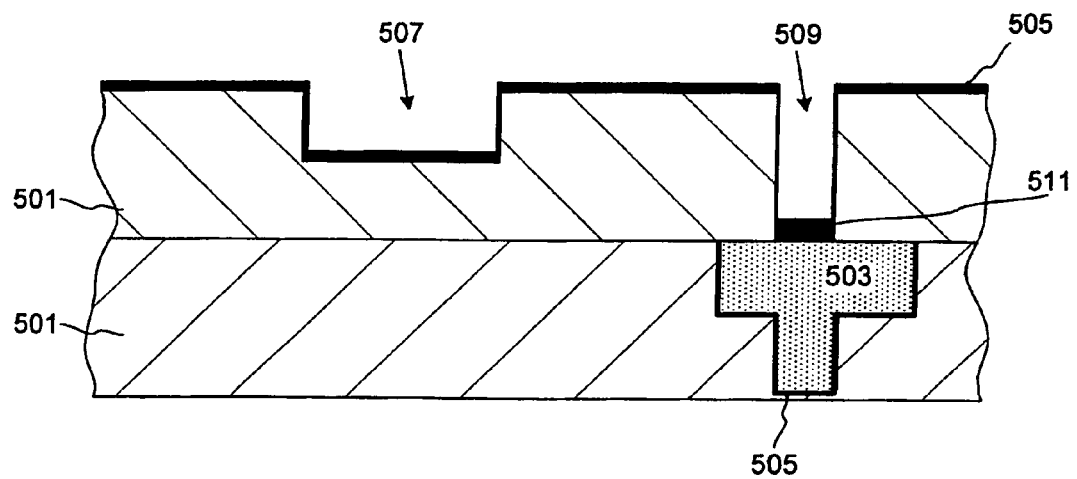
Figure 5C:
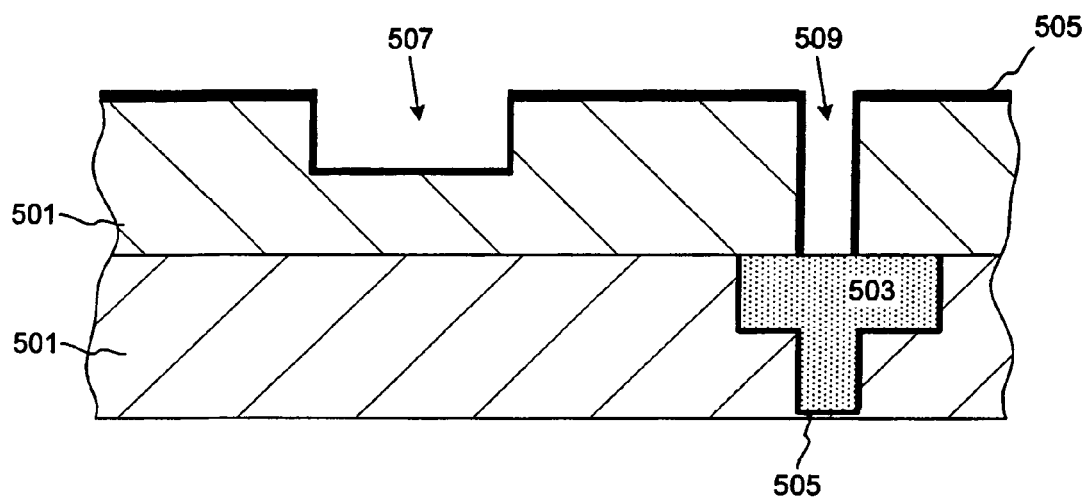

The exposed top dielectric layer is then subjected to a diffusion barrier deposition step resulting in the structure shown in FIG. 5B. It can be seen that after the deposition step diffusion barrier layer 505 covers the surface of top dielectric layer both in the field and in the recesses. The uniformity of such coverage, however, is low, particularly in the via region. There is significant accumulation of the barrier material in the via bottom 511, and a very thin coverage of the via sidewalls. Uniformity of the via coverage is improved through the resputter step, which leads to the structure shown in FIG. 5C. In this structure all of the barrier material is resputtered from the via bottom onto the sidewalls exposing the underlying copper line. The desired result of this operation is a better, more uniform coverage of the sidewalls in the via.

Figure 5D:
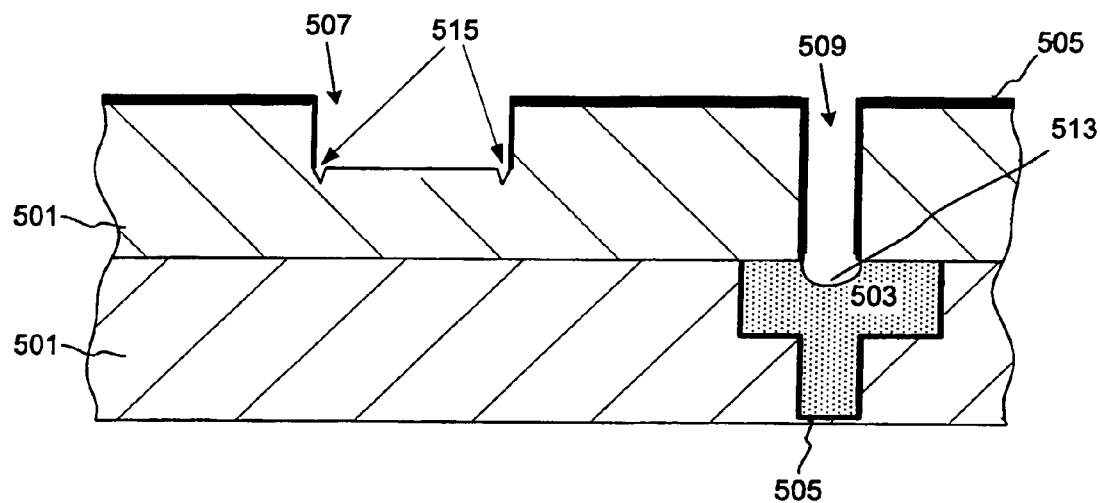

When resputtering is performed further, it etches material of the copper line residing below the via leading to formation of a cavity in the conductive line, known as an anchor. The structure with an anchor 513 is shown in FIG. 5D. The anchor is a desired feature in the fabrication of an IC device since it would result in a mechanically strong and highly conductive pathway when the via is filled with metal. At the same time, resputtering leads to undesired and unintentional changes in the trench region. The bottom of the trench is stripped of the barrier layer, and the dielectric becomes exposed to the impact of high-energy ions. This leads to microtrenching phenomenon. Microtrenches 515 are formed at particular spots in the dielectric layer of the trench bottom, usually in the proximity of the sidewalls. It is believed that reflection of high-energy ions from the trench sidewalls onto particular locations of dielectric in the trench bottom causes increased bombardment of dielectric in these particular sites. The impact of resputtering is, therefore, increased in these spots leading to higher localized etching and formation of microtrenches. This effect is well known in sputter etching and in plasma processing. It is especially pronounced for low-k dielectric, since they are often brittle and easily damaged materials. Microtrenching in silicon dioxide dielectric usually does not occur as readily. Microtrenches can form at any point during the resputtering process when dielectric becomes exposed to argon ions. Depending on the relative thickness of the barrier layer in the trench and in the via bottom, the trench bottom dielectric can become exposed in the beginning or at the end of barrier layer resputtering in the via or during the etch-back of copper line during anchor formation.

Microtrenches are viewed as undesired features in IC devices since they may contribute to level-to-level current leakage and decrease the reliability of the integrated circuit.

Referring to FIG. 5D, the microtrenching phenomenon is illustrated for a resputter process carried out at conventional low pressure of less than 10 mTorr. This conventional process will be further referred to as "low pressure resputter".

Figure 5E:
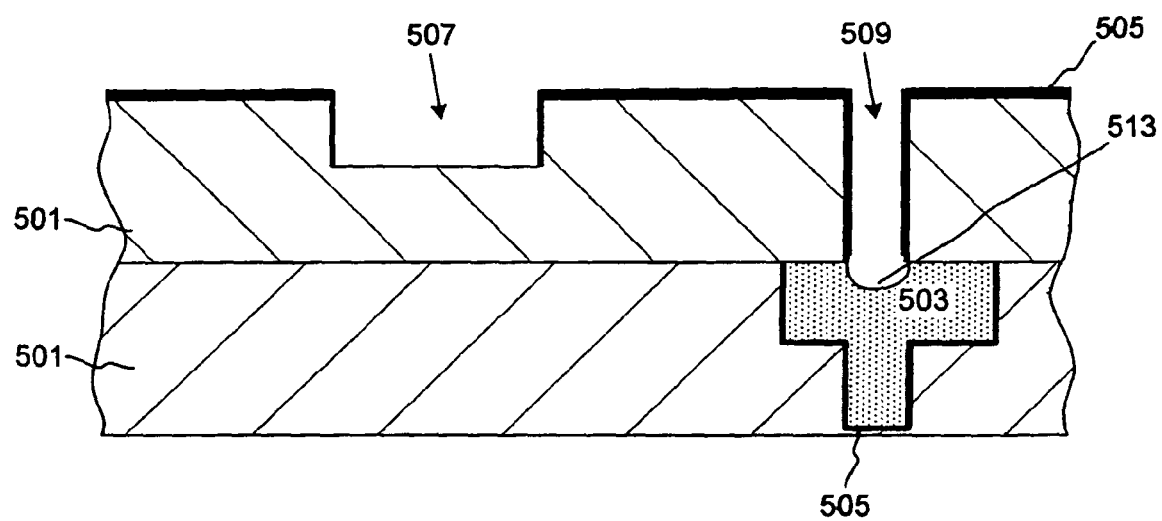
FIG. 5E presents a cross sectional depiction of a partially fabricated integrated circuit obtained by a high-pressure resputter process and illustrates the absence of microtrenches.

In a preferred embodiment of the invention the resputter step is performed at a pressure of at least 10 mTorr or higher ("high pressure resputter"). It is preferably performed in the pressure range of about 30-100 mTorr and more preferably in the range of about 50-70 mTorr. When wafer layers undergo resputtering at these pressure ranges, the damage to dielectric layer is minimal and microtrenching is reduced or eliminated. This is illustrated in FIG. 5E which presents the cross-sectional depiction of a wafer portion, subjected to the same processing steps as structure shown in FIG. 5D, except that resputtering is performed at high pressure. It can be seen that microtrenches did not form in the trench region 507. The effect of high pressure resputtering on the dielectric damage can be rationalized if the energy and mean free path of inert gas ions are considered. During low pressure resputter the microtrenches are formed when the inert gas ions of high energy are arriving to the trench sidewall at grazing angles and are reflected onto the bottom of the trench. The reflected ions arrive to particular spots on the bottom of the trench and etch dielectric material at these spots causing microtrenching. When the pressure is increased, the increased frequency of ion-gas collisions results in a shorter mean free path of individual ions and in a lower kinetic energy of ions reflected onto the dielectric. These lower-energy ions are not energetic enough to cause considerable etching of dielectric. It was experimentally determined that at pressure of at least 10 mTorr and higher, microtrenching is practically eliminated. It was also shown that at pressures greater than 100 mTorr resputtering is occurring too slowly to be of practical importance. These considerations guide the pressure range employed in the present invention.

Performing resputter process at higher pressure also results in an increased E/D ratio. This is a valuable characteristic, since deposition of neutral target material is usually not desired during resputter. At conventionally used pressures of less than 10 mTorr, the E/D ratio reaches the values of up to 1.5, which can be further increased to about 4 by modulation of magnetic field during low-pressure resputtering. High pressure resputter allows achieving E/D ratio of between 4 and 5 without large changes to magnetic field or other parameters of the process. The effect of high pressure on E/D ratio is due to a decrease in the deposition rate. This decrease is believed to occur because neutral material from the target is increasingly sputtered onto the apparatus shields rather than on the wafer due to increased amount of collisions with the argon gas. This leads to an overall decrease in deposition of neutral material on the wafer.

At the pressure ranges noted, there is wide latitude in tailoring other process conditions for the device application and the deposition chamber. In certain embodiments, the wafer is maintained at a temperature of between about −50 and 600° C., or more preferably between about −40 and −20° C. The temperature of the wafer can be controlled, for example, by setting the wafer chuck, such as electrostatic bipolar chuck, to maintain an appropriate temperature at the wafer. The flow rate of process gases will depend on the chamber design and configuration. In a typical case, argon and/or krypton is provided to an HCM chamber at a flow rate of between about 10 and 300 sccm, more preferably between about 100 and 200 sccm. In certain embodiments, particularly those involving deposition of nitride barrier layers, nitrogen may be provided to the chamber during the deposition step.

During deposition, argon and nitrogen can be provided to the reactor at different ratios. The argon to nitrogen ratios may range from about 0.5:1 to about 20:1, preferably from about 0.8:1 to about 10:1. In specific examples, 1:1 and 10:1 ratios have been used. Ranges of appropriate bias power and power applied to the target are identified above.

Finally, it should be understood that there may be embodiments where the pressure is intentionally varied over a defined range during the resputtering and/or deposition operations. Also, in some embodiments, one pressure is used during deposition and a different pressure is used during resputter.

While the present invention can be practiced in many different types of apparatus, two main types of iPVD apparatus, hollow cathode magnetron (HCM) and planar magnetron, will now be briefly described. Hollow cathode magnetron is an apparatus carrying a three-dimensional sputter target. The present invention is not limited to a specific cup-like geometry of an HCM target and can be used in conjunction with three-dimensional targets of a plurality of shapes.

Figure 6A:
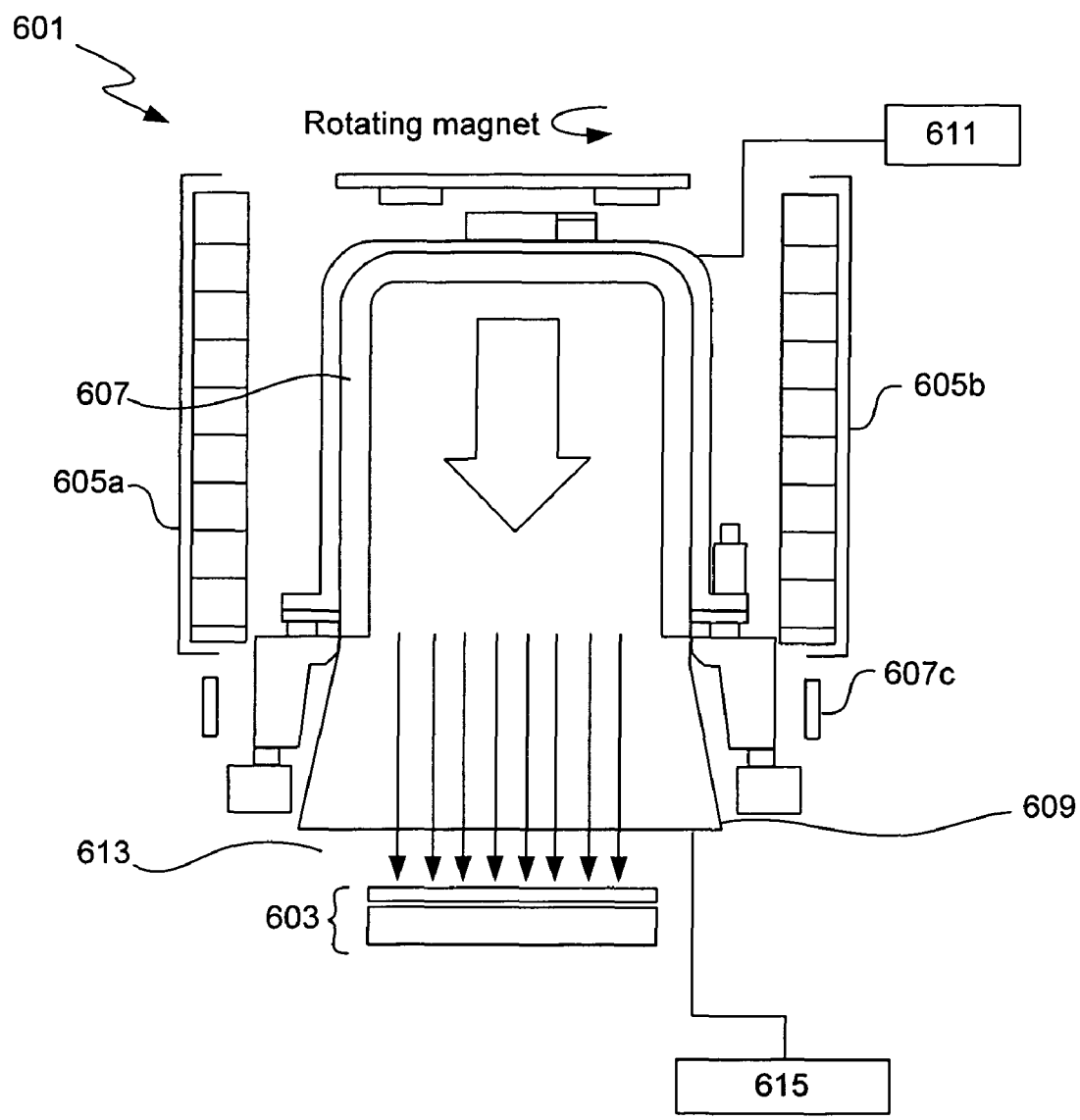
FIG. 6A is a cross sectional depiction of the hollow cathode magnetron (HCM) apparatus suitable for practicing the current invention.

FIG. 6A presents a cross sectional view of one type of HCM sputtering apparatus that can be used in accordance with the invention. The HCM apparatus has two main components, the source 601, in which a plasma is created and maintained, and the RF bias electrostatic chuck (ESC) pedestal 603, which secures the wafer and applies an RF bias on the wafer, if needed. In this example, the source 601 contains several electromagnets 605a-605c, a cathode target 607 and a shield 609, often referred to as an anode. The cathode target 607 generally has a hollow cup-like shape so that plasma formed in the source can be concentrated within this hollow region. The cathode target 607 also serves as a sputter target and is, therefore, made of a metal material such as tantalum, which is to be deposited onto a substrate.

An inert gas, such as argon, is introduced through a gas inlet 613 into the hollow region of the cathode target 607 powered by a DC source to form a plasma. The pump 615 is positioned to evacuate or partially evacuate the process chamber. The control of pressure in the process chamber can be achieved by using a combination of gas flow rate adjustments and pumping speed adjustments, making use of, for example, a throttle valve or a baffle plate. Alternatively, pressure above the wafer can be controlled by varying the height of the wafer pedestal 603. At an increased pedestal height, slower gas flow results in a higher pressure above the wafer. An intense magnetic field is produced by electromagnets 605a-605b within the cathode target region. Additional electromagnets 605c are arranged downstream of the cathode target so that different currents can be applied to each electromagnet, thereby producing an ion flux and a controlled deposition and/or etch rate and uniformity. A floating shield 609, existing in equilibrium with the floating plasma potential, is used, in conjunction with the source electromagnets to shape the plasma distribution at the target mouth. A stream of ions is directed to the surface of the wafer, as shown by arrows on FIG. 6A. The ESC pedestal 603 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50-600° C. In practice it is often advantageous to cool the wafer pedestal down to temperatures of about −40-20° C. while the shields of an apparatus are kept at a higher temperature of about 25-500°

C., preferably 100-200° C. Typically, argon or helium backside gas is used to provide thermal coupling between the substrate and the ESC.

In certain embodiments, a system controller 611 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, chamber pressure, chamber temperature, wafer temperature, RF power levels, wafer chuck or susceptor position, and other parameters of a particular process. Other computer programs stored on memory devices associated with the controller may be employed in some embodiments.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma control program may include code for setting RF power levels applied to the process electrodes at the target and the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

Figure 6B:
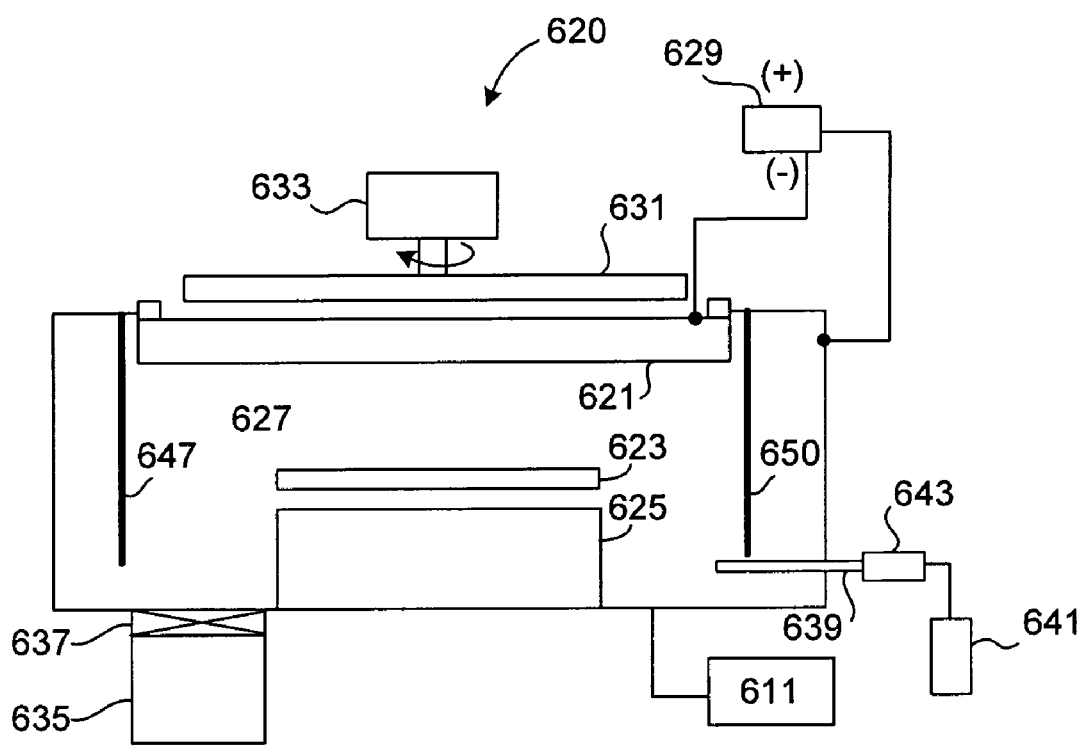
FIG. 6B is a cross sectional depiction of a planar magnetron suitable for practicing the current invention.

FIG. 6 B shows a schematic representation of a planar magnetron 620 which can also be used to practice present invention. Target 621, a circular, planar block of material to be deposited, is spaced from the wafer 623, which is mounted on a heating stage 625 in chamber 627. A dc power supply 629 is used to apply a dc field to target 621, establishing a plasma in the chamber below target 621. A circular magnet 631 mounted above the target is rotated by motor 633 setting up a magnetic field extending through target 621 into the region between the target 621 and wafer 623. Cryopump 635 connected to chamber 627 via valve 637 is used to evacuate the chamber. Process gas injector 639 is connected to process gas supply 641 via mass flow controller 643. A sputtering gas is introduced into chamber 627 via injectors 639. It is understood that the structure of module 620 is exemplary only. The methods of present invention may be practiced in other types of planar magnetrons, such as ones having ICP sources. However, it should be understood that since planar magnetrons with ICP sources normally operate at higher pressure than HCM, they should be operated at an even higher pressure in order to achieve the benefit of microtrenching reduction. In one embodiment of this invention certain planar magnetrons, such as magnetrons with internal or external ICP sources, are operated at a pressure range of between about 50 and 100 mTorr, preferably between about 60 and 90 mTorr.

Figure 7A:
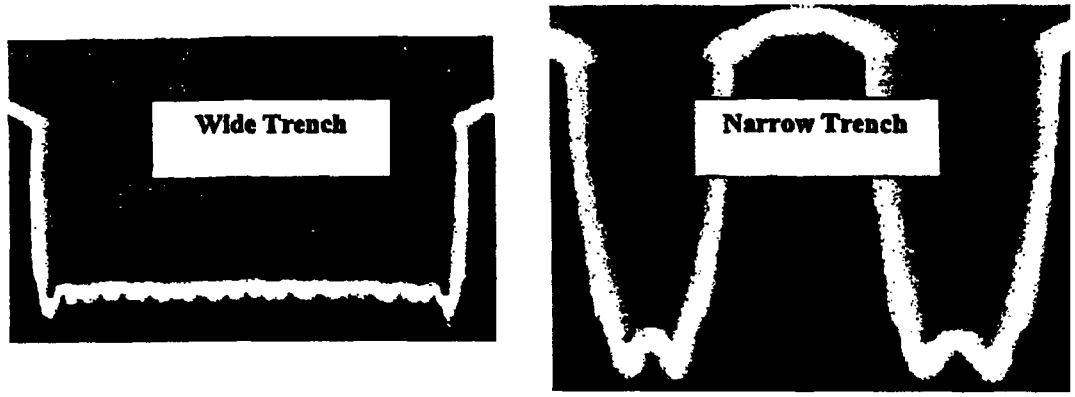
FIGS. 7A-7B represent experimental data showing SEM photographs of device cross-sections illustrating trenches subjected to low-pressure (7A) and high pressure (7B) resputtering.
Figure 7B:
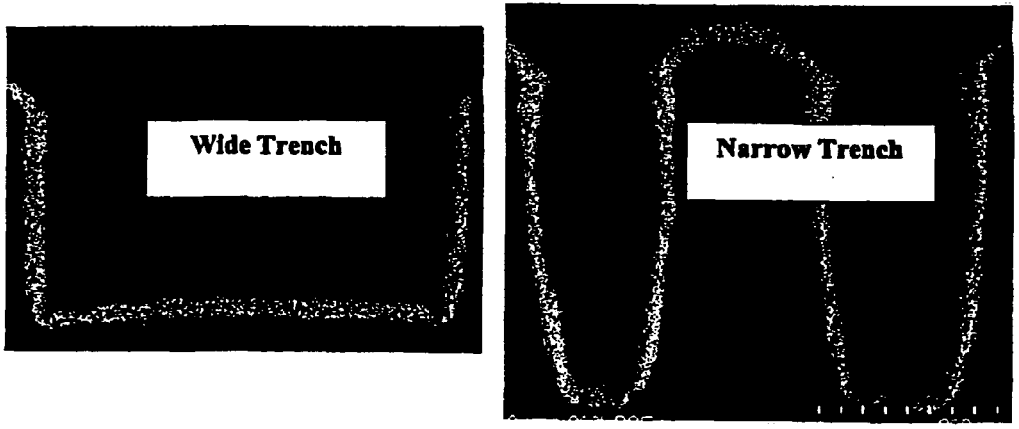

The methods of present invention have been evaluated experimentally. FIG. 7 A presents an SEM cross-section of a semiconductor structure that was resputtered in a conventional manner. The figure illustrates the microtrenching phenomenon in wide and narrow trenches. A cross-section of one wide trench and two narrow trenches is shown. The presented trenches are coated with the barrier material (white layer) and filled with a conductive material to achieve a better quality of a photograph. The black layer outside of the trenches is the layer of dielectric. The microtrenches can be observed in the proximity of the sidewalls in the bottom of all three presented trenches. These structures resulted from resputtering at a conventionally used low pressure (2 mTorr).

FIG. 7 B shows the same cross-section of wide and narrow trenches but for a process employing a high-pressure resputter (70 mTorr) in accordance with some embodiments of this invention. The bottom corners of all three trenches are smooth and are essentially free from microtrenches.

Figure 8:
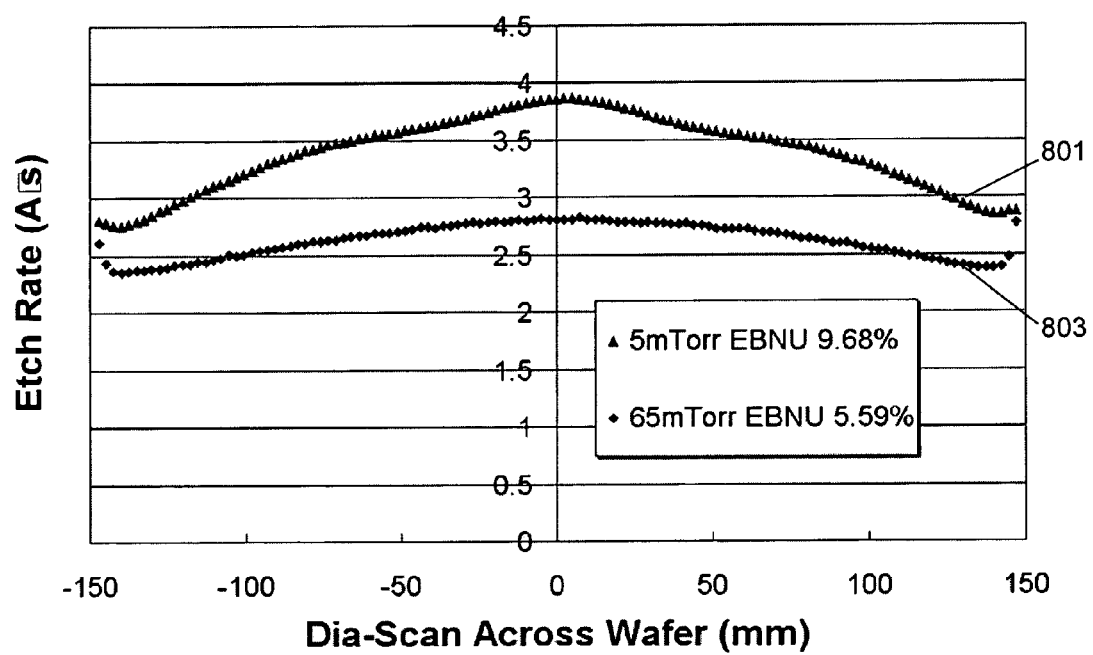
FIG. 8 represents experimental data illustrating etch-back nonuniformity for low-pressure (curve 801) and high-pressure (curve 803) resputter processes.

The third important advantage of high pressure resputter is the improvement of etch-back nonuniformity (EBNU) as illustrated in FIG. 8. A plot of the etch rate dependence on the wafer position is presented. It can be seen that during low-pressure resputter (curve 801) considerable EBNU is observed which is characterized by a much larger etch rate in the center of the wafer than on the edge. The nonuniformity presents a problem in IC fabrication, since some features are overetched while others remain filled with too much material during resputter. In the presented example, resputtering at low pressure (5 mTorr, curve 801) leads to EBNU of about 10%, while resputtering at high pressure (65 mTorr, curve 803) reduces EBNU to less then 6%. In the case of high-pressure resputter only very small variation of etch rate is observed throughout the surface of the wafer. This improvement is believed to result from the increased scattering of argon ions during high pressure resputter. The flow of ions in the iPVD system is known to have center-focused uniformity. The increased number of ion collisions with $Ar^0$ background gas leads to increased scattering of center-directed ions, and results in a more uniform ion flow toward the wafer.

In a specific example, a tantalum barrier layer is deposited on a wafer, and is then resputtered with argon ions at a pressure of 65 mTorr. Argon gas is introduced into the process chamber at a flow rate of 700 sccm. A 6 kW DC current is applied to the tantalum target, and a 1.2 kW RF bias is applied to the wafer ESC chuck. The temperature of the ESC chuck is set to −10° C. These conditions are presented as an example of a high-pressure resputter process suitable for reducing microtrenching and etch-back non-uniformity.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of depositing a metal-containing material on a semiconductor wafer layer having recessed features, the method comprising:
   (a) depositing a layer of the metal-containing material on the wafer to coat the recessed features; and
   (b) resputtering the layer under a pressure of at least 10 mTorr in an apparatus without an ICP source in the presence of exposed dielectric, wherein resputtering results in net etching of the metal-containing material.

2. The method of claim 1, wherein depositing the layer of metal-containing material comprises sputtering the metal-containing material using iPVD.

3. The method of claim 1, wherein the metal-containing material is a diffusion barrier material.

4. The method of claim 1, wherein the metal-containing material comprises a material selected from the group consisting of Ta, $TaN_x$, Ti, $TiN_x$, W, $WN_x$, Ru, and Co.

5. The method of claim 1, wherein the metal-containing material is copper.

6. The method of claim 1, wherein the recessed features are vias and trenches.

7. The method of claim 6, wherein the recessed features are in a low-k dielectric layer, and wherein the low-k dielectric material becomes exposed on the wafer during the resputtering of the metal-containing material.

8. The method of claim 1, wherein the depositing and resputtering operations are performed in the same process chamber.

9. The method of claim 8, wherein the process chamber is an HCM.

10. The method of claim 8, wherein the process chamber is a planar magnetron.

11. The method of claim 1, wherein steps (a) and (b) are repeated at least once.

12. The method of claim 1, wherein the pressure used in step (b) is about 30-100 mTorr.

13. The method of claim 1, wherein the pressure used in step (b) is about 50-70 mTorr.

14. The method of claim 1, wherein the resputtering comprises exposing the dielectric layer at the bottom of a trench, while etching a metal-containing material at the bottom of the via.

15. The method of claim 1, wherein the resputtering comprises forming an anchor recess in an underlying layer of a Damascene structure.

16. The method of claim 15, wherein forming an anchor recess in an underlying layer of a Damascene structure comprises exposing a dielectric layer at a bottom of the trench.

17. The method of claim 16, wherein the exposed dielectric layer comprises a low-k dielectric.

18. A method of modifying a metal-containing material on a semiconductor wafer layer comprising resputtering the metal-containing material under a pressure of at least 10 mTorr in an apparatus without an ICP source, in the presence of exposed dielectric, wherein resputtering results in net etching of the metal-containing material.

19. The method of claim 18, wherein the pressure is about 30-100 mTorr.

20. The method of claim 18, wherein the pressure is about 50-70 mTorr.

21. The method of claim 18, wherein the dielectric becomes exposed during the resputtering of the metal-containing material.

22. The method of claim 18, wherein the metal-containing material is the diffusion barrier material.

* * * * *